United States Patent

George

[15] 3,688,198

[45] Aug. 29, 1972

[54] VHF AND UHF AUTOMATIC GAIN CONTROL CIRCUITRY DERIVED FROM A SINGLE CONTROL VOLTAGE

[72] Inventor: John Barrett George, Indianapolis, Ind.

[73] Assignee: RCA Corporation, New York, N.Y.

[22] Filed: April 14, 1971

[21] Appl. No.: 133,805

[52] U.S. Cl. ................325/404, 178/7.3 R, 325/400, 325/405

[51] Int. Cl. ................H04b 1/28

[58] Field of Search......325/319, 400, 402, 403, 404, 325/405, 408, 409, 410, 411, 461

[56] References Cited

UNITED STATES PATENTS

| | | | |
|---|---|---|---|
| 3,242,433 | 3/1966 | Carlson | 325/461 |
| 3,548,315 | 12/1970 | Lehmann | 325/410 |

*Primary Examiner*—Robert L. Griffin

*Assistant Examiner*—Kenneth W. Weinstein

*Attorney*—Eugene M. Whitacre

[57] ABSTRACT

A television receiver includes VHF and UHF tuners, each having a separate radio frequency amplifier. The AGC control voltage developed in the receiver and used for VHF gain control is adapted to control the gain of the UHF tuner and to otherwise accommodate the different gain characteristics of the UHF amplifier.

6 Claims, 3 Drawing Figures

INVENTOR.
JOHN BARRETT GEORGE
BY
ATTORNEY

INVENTOR.
JOHN BARRETT GEORGE
BY [signature]
ATTORNEY

VHF AND UHF AUTOMATIC GAIN CONTROL CIRCUITRY DERIVED FROM A SINGLE CONTROL VOLTAGE

This invention relates to television tuners and, more particularly, to gain control apparatus for use with such tuners.

Present authorization for the transmission of television signals includes 12 channels in the very high frequency (VHF) band, and 70 channels in the ultra high frequency (UHF) band. According to recent United States Government policy, it is required that the UHF band be treated on a substantially equal basis with the VHF band. This concept has been referred to as the "parity of tuning" requirement.

Many prior art television receivers included a UHF tuner before the regulations governing parity of tuning were formulated. Certain prior art UHF tuners did not contain a radio frequency (RF) amplifier. These tuners usually included a tunable UHF bandpass filter, a diode mixer and a tunable UHF oscillator. The mixer was responsive to the received UHF signals and to the UHF oscillator signal to provide at an output a video intermediate frequency (IF) signal. The UHF oscillator operated and tracked approximately 43 MHz above the frequency propagated through the bandpass filter, the difference between the signals being approximately equal to the video IF. In such prior art tuners the diode mixer did not produce substantial distortion of the UHF signal for most signal levels, nor did it provide large output signals. Hence, in such UHf tuners there was no necessity to provide separate UHF gain reduction because of the limitations of the mixer.

In any event, the AGC circuit included in the television receiver operates in response to the signal output available at the video detector. As this signal begins to increase above a predetermined level, the AGC circuit serves to control the bias of an RF amplifier in the VHF tuner and thus reduce the detector signal level during VHF operation. In certain of these prior art tuners, during UHF operation the VHF tuner served as an IF preamplifier. Since the VHF tuner acted accordingly, during large UHF signals the gain of this stage was decreased and hence a gain reduction was afforded for UHF operation.

Presently, it is desirable to include an active amplifying device in the UHF tuner in order to increase the amplitude of the signals provided thereby, and to further isolate the UHF tuner from the VHF circuitry. The gain advantage enables one to overcome losses afforded by the UHF bandpass filter and mixer. The isolation provided is desirable as it eliminates coupling between the UHF and VHF tuners, thus permitting one to obtain a more reliable tuner operation. This concept serves to aid in implementing the parity of tuning requirements in that the consumer — with separate UHF and VHF tuners, including separate amplification — will be assured of a more constant response to transmitted signals. This operation thus provides a generally more pleasing display.

However, in providing the separation of the VHF and UHF functions, one still has to assure that the AGC control voltage developed in the receiver chassis serves to operate reliably for both the UHF and VHF modes. Therefore, such configurations necessitate a separate control voltage for VHF and UHF, both of which may be derived from the common receiver AGC circuitry, as will be explained.

According to the invention, the receiver AGC control voltage used for VHF gain control is applied to a high input impedance transistor amplifier necessary to prevent loading of the AGC source. The high input impedance of the amplifier maintains a value proportional to the product of the amplifier current gain and the emitter feedback resistance unless saturation of the amplifier forces increased current conduction into the base electrode. Means are connected to the output terminal of the amplifier to assure that the input impedance is maintained at a high level by preventing the voltage at the output from falling below a predetermined value, thus preventing amplifier saturation.

The controlled output is then applied to a UHF radio frequency amplifier to vary the gain thereof in a forward biased mode as opposed to the reverse biased gain variation of the VHF stage.

A description of the invention will be given with reference to the following figures, in which.

Figures 1, 3:
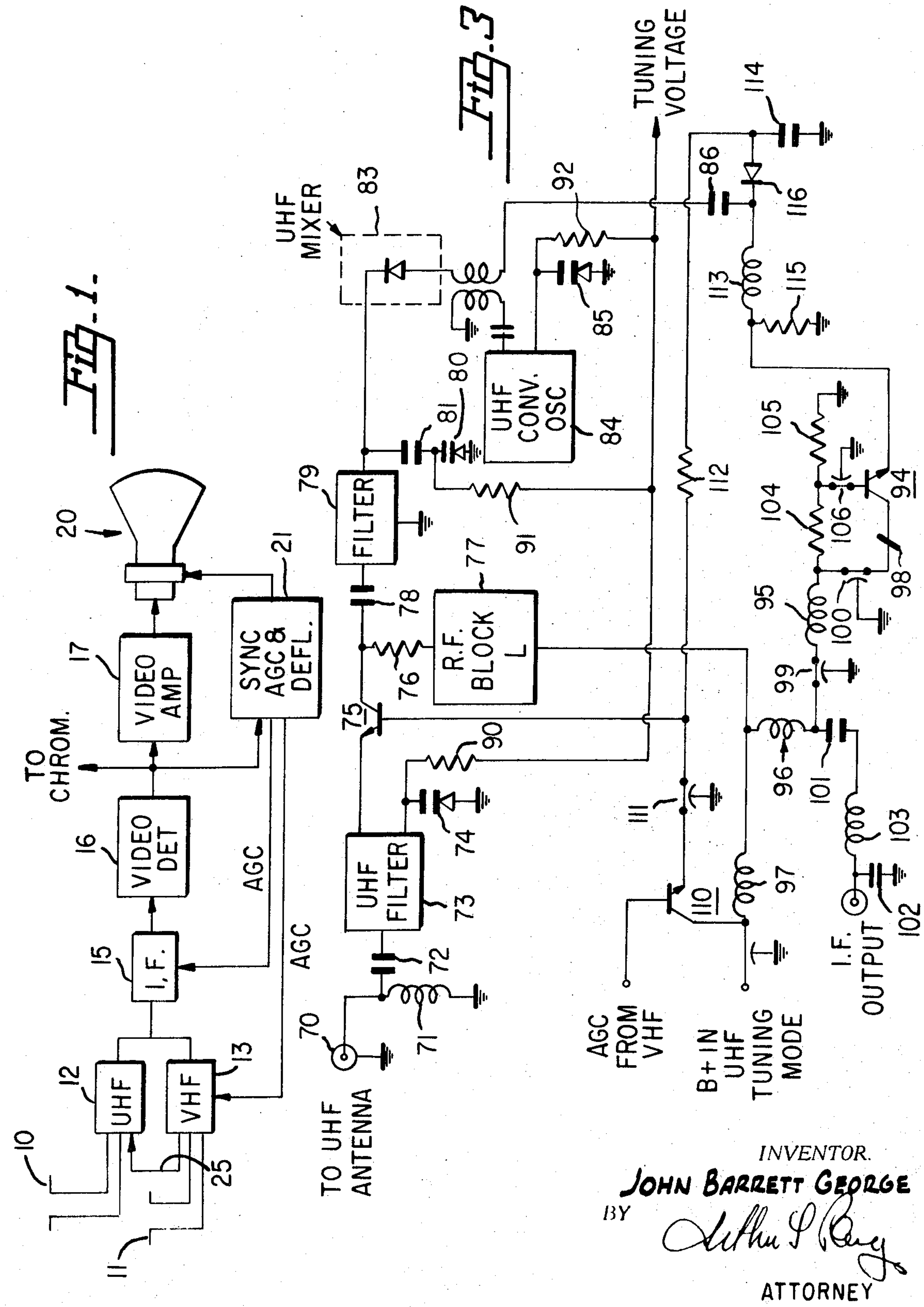
FIG. 1 is a block diagram of a television receiver having a VHF tuner.
FIG. 3 is a schematic diagram partially in block form of a UHF tuner to be gain controlled according to this invention.

FIG. 1 shows a UHF antenna 10 and a VHF antenna 11. UHF antenna 10 is dimensioned to be responsive to those ultra high frequency signals representative of the 70 UHF channels, while the VHF antenna 11 responds to the 12 channel VHF band. The output terminals of antennas 10 and 11 are respectively coupled to the input of a UHF tuner 12 and a VHF tuner 13. Each tuner 12 and 13 contains an RF amplifier stage and a tunable filter. As will be seen, a common output stage may be conveniently employed for both the UHF and VHF frequency band. The outputs of the tuners 12 and 13 are coupled to an IF amplifier 15 having an output applied to the video detector 16. The video detector, as is known, serves to produce the video signal from the applied IF signal. This video signal is applied via video amplifier 17 to the appropriate control electrodes of an image display device or kinescope 20.

Conventionally, an output of the video detector 16 or an output from a suitable video amplifier is also applied to sync, AGC and deflection circuitry 21. Such circuitry serves to provide suitable waveforms synchronized to horizontal and vertical information present in the video signal and necessary for producing a stable raster display for kinescope 20.

In particular, the AGC circuitry serves to monitor the output of the detected video signal to assure that the signal applied to the kinescope remains relatively constant in amplitude, in spite of changes in amplitude of the signal as received by the antennas 10 and 11.

Conventionally, most prior art television receivers generate an AGC control voltage which serves to vary the gain of the IF amplifier 15 according to the level of the detected video signal. After a predetermined amount of gain reduction is afforded by the IF amplifier, the AGC circuit then serves to provide still another control voltage which serves to reduce the gain of the VHF tuner 13. As previously indicated, it was this control signal to the RF amplifier in the VHF tuner which served to afford gain control during UHF operation. This operation followed the utilization of this RF amplifier as a UHF intermediate frequency amplifier.

However, when the UHF tuner contains a separate RF amplifier device, which is solely utilized for UHF operation, the above-noted prior art technique is not usually necessary.

Therefore, FIG. 1 shows a lead 25 which is directed from the VHF tuner 13 to the UHF tuner 12. As will be explained subsequently, this lead accommodates an AGC voltage which is derived from the AGC voltage applied by the receiver to the VHF tuner, and which voltage serves to provide the proper gain control for the UHF, RF amplifier device.

Figure 2:
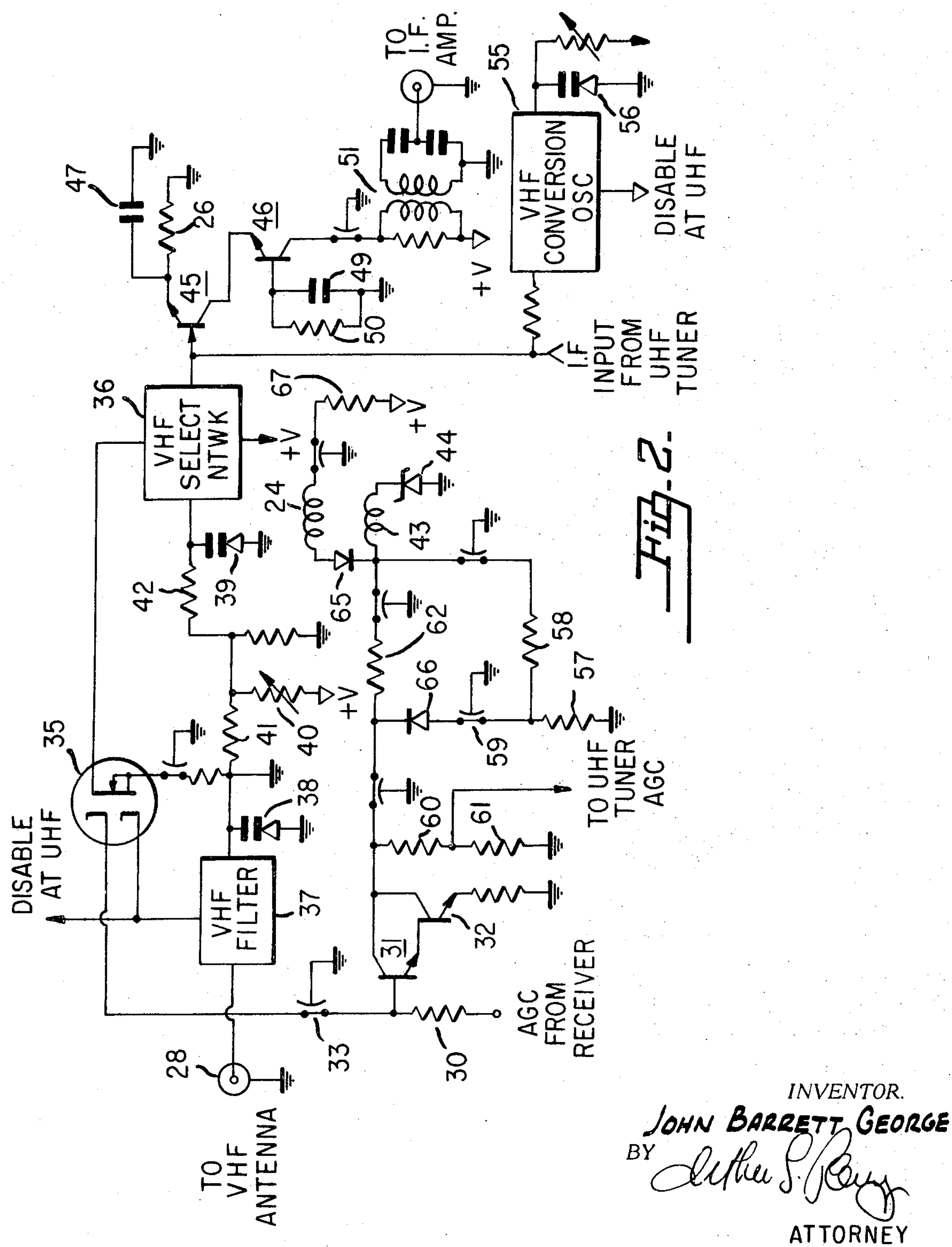
FIG. 2 is a schematic diagram partially in block form of a VHF tuner incorporating UHF AGC control circuitry according to the invention.

FIG. 2 shows an AGC voltage input from AGC circuitry, such as that included in module 21 of FIG. 1. The AGC voltage is applied via a resistor 30 to the base electrode of a first transistor 31 arranged with another transistor 32 in a beta multiplication circuit. Such a circuit provides a relatively low output impedance at the emitter electrode of transistor 32 and a high input impedance at the base electrode of transistor 31. The same AGC voltage is also applied through a feedthrough capacitor 33 to a first gate electrode of a dual gate field effect transistor (FET) 35 utilized as a VHF radio frequency amplifier.

The drain electrode of FET 35 is coupled to a VHF selective network 36 which serves to provide selectivity for the VHF signals. Received VHF signals are applied to a second gate electrode of the FET 35 via a VHF filter 37 having an input terminal 28 coupled to a conventional VHF antenna. As is shown schematically, the input filter 37, as well as the selective network 36, is shunted by varactor diodes 38 and 39 respectively. A varactor diode is a device whose capacitance varies according to an applied voltage. Such devices are well known in the art and have been used in electronic tuning applications. The circuit also schematically shows a potentiometer 40 having one terminal coupled to a source of operating potential +V. The potentiometer 40 has its other terminal connected, through suitable resistors or other isolating elements 41 and 42, to the appropriate electrodes of the varactor diodes 38 and 39. The frequency responses of both the VHF filter 37 and the output selective network 36 may be varied by means of the varying DC voltage afforded by potentiometer 40. In this manner the tuner is electronically tuned as compared to the prior art techniques of varying a mechanically ganged capacitor.

The output of the selective network 36 is applied to the base electrode of a mixer transistor 45 having its emitter electrode returned to ground through a parallel resistor 26-capacitor 47 combination. Transistor 45 has its collector electrode coupled to the emitter electrode of a common base amplifier transistor 46. The common base transistor 46 has its base bypassed to ground via the parallel combination of capacitor 49 and resistor 50 for IF signal frequencies. The collector electrode of transistor 46 is coupled to the primary side of an output transformer 51. The function of transformer 51 is to provide additional IF selectivity and impedance matching from the VHF tuner to the IF amplifier.

The base electrode of transistor 45 is also returned to the output of a VHF conversion oscillator 55. The oscillator 55 is selected such that the difference between the oscillator frequency and a particular VHF frequency approximates the frequency of the video IF signal. Oscillator 55 is of the type whose frequency varies according to the voltage variation on a suitable varactor diode 56 coupled to the frequency determining network of the oscillator 55. The voltage across varactor 56 is varied according to variation of potentiometer 40 as described above. Oscillator 55 therefore is made to track with VHF tuning selection. Such techniques for tracking varactors and controlling such circuits as described above are known in electronic tuners. Transistor 45 is biased in a nonlinear region. Due to the fact that transistor 45 has both the VHF frequency signal and the VHF conversion oscillator signal applied to its base electrode, it operates in a mixer mode and thereby produces the desired IF frequency at an output, which is suitably filtered by tuning the transformer 51.

Before proceeding with further description, a few comments concerning the AGC circuitry and AGC voltage as briefly described above will be given.

Typical AGC circuits as contained in module 21 of FIG. 1 provide an AGC control voltage across a relatively high output impedance. Therefore, it is imperative that the circuitry which operates in accordance with the magnitude of this AGC voltage does not serve to adversely load the high impedance circuitry. When an FET device as 35 is utilized as an RF amplifier in the VHF tuner, the AGC voltage provided by the receiver has to vary between a positive level for a maximum gain and a negative level for minimum gain. While such FET devices may be conveniently used in VHF tuner applications, at the state of the present art it would be desirable to utilize bipolar devices in the UHF tuner. Such bipolar devices necessitate an increasing collector current to afford gain reduction. This is so as it is preferable to use a forward AGC gain reduction technique with such bipolar devices when operating at high frequency. Due to the characteristics of the transfer function of such bipolar devices for the so-called forward AGC mode, one has better control over the reactive variations of the device with varying collector current. Thus with the above considerations in mind, it is apparent that there is a difficulty in gain controlling a UHF amplifier from the same voltage that serves to gain control the VHF amplifier.

The UHF control circuitry thus includes a high input impedance amplifier formed by transistors 31 and 32. The common collector electrode connection of transistors 31 and 32 is returned to a point of reference potential via the series combination of resistors 60 and 61. The junction between these resistors provides the necessary polarity and voltage level for performing AGC control of the amplifier included in the UHF tuner. Operating potential for transistors 31 and 32 is derived by connecting the collector electrodes of these transistors to a source of operating potential via resistor 62. Accordingly, resistor 62 has one terminal coupled to the collector electrodes of transistors 31 and 32 and the other terminal coupled to an RF blocking inductor 43. The other terminal of inductor 43 is coupled to a point of reference potential via a voltage reference diode or Zener diode 44. A source of operating potential is applied to the junction between inductor 43 and resistor 62 via a diode 65 in series with an RF blocking inductor 24 and a current limiting resistor 67.

The junction between the collector electrodes of transistors 31 and 32 and resistor 62 is coupled to the cathode of a clamping diode 66, having its anode coupled to the junction between a pair of voltage divider resistors 57, 58 via a feedthrough capacitor 59. A voltage bias for the voltage divider is obtained by coupling one terminal of resistor 58 to the above-noted junction between inductor 43 and resistor 62.

Basically, the above-described circuit components including transistors 31 and 32, the diode 66, resistor 62 serve to furnish the UHF AGC bias necessary to control the UHF tuner as will be described.

FIG. 3 shows an input terminal 70 for coupling to a suitable UHF antenna. The terminal 70 is connected to a point of reference potential via an inductor 71 which serves as an impedance terminating element for the UHF antenna. A capacitor 72 applies the UHF signal frequencies to a UHF filter 73, which can be tuned by means of a varactor diode 74.

The output of filter 73 is coupled to the emitter input electrode of a common base bipolar transistor amplifier 75.

This stage provides voltage gain for the UHF signal frequencies as applied to the emitter electrode. The collector electrode of transistor amplifier 75 is coupled to a source of operating potential (B+) via a voltage limiting resistor 76 in series with RF blocking inductor 77.

The amplified UHF output signal taken at the collector of transistor 75 is applied via a capacitor 78 to the input of a UHF filter network 79. The filter 79 is comprised of transmission line elements to accommodate the UHF frequency band. The filter 79 is also electronically tunable by means of one or more associated varactor diodes as diode 80.

The filtered UHF signal frequencies available at the output of filter 79 are applied to an electrode of a UHF mixing diode circuit 83.

Another input to the mixing diode 83 is obtained by magnetic coupling to the output of a UHF conversion oscillator 84. Oscillator 84 is tuned by means of varactor diode 85 and tracks with UHF tuning, so that the difference in frequency between the UHF signal and the oscillator 84 signal is made equal to the video IF frequency. The commonality of tuning is shown by the common tuning voltage supply coupled via resistors 90, 91 and 92 to the varactors 74, 80 and 85. The output of the mixer diode 83 is applied via a capacitor 86 to the emitter input of a video IF pre-amplifier including a transistor 94.

The collector electrode of transistor 94 receives operating bias from the B+ line via inductors 95, 96 and 77. A ferrite bead 98 surrounds the collector lead of transistor 94 to prevent spurious oscillations. The collector circuit of transistor 94 also includes feedthrough capacitors 99 and 100 and the output tank configuration of capacitors 101, 102 and inductor 103. These elements in conjunction with the above-mentioned collector components provide selectivity and impedance matching for the video IF signal developed by the above-described UHF tuner. Base bias for transistor 94 is obtained via resistor 104 and 105. The base electrode is further bypassed to ground for AC signals by capacitor 106.

For details involving the exact nature of the above-described tuner, in regard to the particular UHF oscillator, filter arrangements and varactor control and tuning techniques, reference is made to the following patent applications, all of which are assigned to the same assignee as herein, and all filed on Mar. 23, 1970:

1. Ser. No. 21,898 entitled "ELECTRONICALLY TUNED ULTRA HIGH FREQUENCY TELEVISION TUNER WITH FREQUENCY TRACKING TUNABLE RESONANT CIRCUITS" by John Barrett George and Stephen Earl Hilliker;
2. Ser. No. 21,901 now U.S. Pat. No. 3,624,754, entitled "ULTRA HIGH FREQUENCY OSCILLATOR UTILIZING TRANSMISSION LINE TUNABLE RESONANT CIRCUITS" by Stephen Earl Hilliker and John Barrett George; and
3. Ser. No. 21,563 entitled "ELECTRONICALLY TUNED ULTRA HIGH FREQUENCY TELEVISION TUNER" by David John Carlson.

THE AGC CONTROL PATHS FOR UHF TUNER OPERATION

The AGC voltage derived from the junction of resistors 60 and 61 shown in FIG. 2 is applied to the base electrode of transistor 110 shown in FIG. 3.

The collector electrode of transistor 110 is returned to the UHF B+ supply. It is also noted that when the television receiver is responsive to UHF, the B+ line shown in FIG. 3 is energized. This can be accomplished by an appropriate switch operating in conjunction with the consumer selection of the UHF mode. Such switching techniques are known and not considered part of this invention.

It is also noted that because of the separation of functions between the UHF and VHF tuners that VHF tuner operation is inhibited when a UHF tuning mode is selected.

The implementation of the inhibiting action is shown in FIG. 2.

The VHF RF amplifier is cutoff by the application of a suitable negative potential to the gate electrode of FET 35. Alternatively, the operating bias may be removed to render the VHF, RF amplifier inoperative. This prevents any VHF signals from coupling through to the output mixer stage 45.

The VHF oscillator 55 is also disabled during the UHF mode, thus preventing VHF conversion oscillator signal from being applied to transistor stage 45.

The emitter electrode of transistor 110 (FIG. 3) is coupled to the base electrode of UHF, RF transistor 75. A feedthrough capacitor 111 serves as an AC bypass for the emitter electrode of transistor 110 and the base electrode of transistor 75.

The emitter electrode is also coupled via a resistor 112 to the anode of a diode 116 whose cathode is coupled to the emitter electrode of transistor 94 via an inductor 113.

The anode of diode 116 is bypassed to ground for AC signal via a capacitor 114, while the cathode is returned to ground for DC via inductor 113 in series with resistor 115.

AGC OPERATION IN THE UHF TUNER MODE

AGC, as indicated, is performed in the television receiver by monitoring the level of the signal at the output of the video detector. The AGC circuit serves to control the IF amplifier in the receiver to reduce its gain, and then, if further reduction is necessary, serves to control the gain of the RF amplifier. Typical voltage levels that may be provided by an AGC circuit and used to control the VHF, RF amplifier would be from about −2 volts for minimum RF gain to about −7 volts for maximum RF gain. The excursion between negative and positive potentials is necessary to provide a gain reduction for the field effect transistor 35 which is, as indicated, the RF amplifier for the VHF mode.

During UHF operation, this amplifier is cut-off and nonconducting. Therefore, UHF gain control cannot be provided with this device. However, the UHF, RF transistor amplifier 75 should be gain reduced in the UHF mode to prevent signal overload in the receiver. The above-noted AGC supply in the receiver, which is furnishing the −2 to +7 voltage range, is developed across a relatively high impedance source. Hence, transistor 31, which has this voltage applied to its base electrode via resistor 30 (FIG. 2), forms a high input impedance beta multiplication circuit with transistor wherein the input impedance of the circuit is proportional to the product of the beta of each stage multiplied by the value of the resistor coupled between the emitter of transistor 32 and the point of reference potential. The impedance afforded by this configuration is extremely high to thereby prevent loading of the AGC supply. The voltage at the emitter electrode of transistor 32 is maintained at about 1.0 volts or 2 $V_{be}$ volts less than the voltage at the base of transistor 31. Therefore, the voltage at the emitter of transistor 32 corresponds to and follows the AGC voltage at the base of transistor 31. The voltage at the collector of transistor 32 is determined in part by the current through resistor 62, and in part by the current through diode 66. In order to explain how these currents are controlled, it will be advantageous to first describe the operation of the bias supply for this stage.

During UHF operation +30 volts is applied via resistor 67 through the diode 65 to the junction between the inductor 43 and resistor 62. The Zener diode 44 serves to regulate the voltage at that junction to approximately 15 volts with respect to ground. The inductor 43 prevents the high frequency noise generated by the Zener from adversely affecting the circuit operation.

In order to describe the operation of the amplifier, three particular voltage conditions will be considered:

1. The maximum gain condition represented by the +7 volts appearing at the input to transistor 31.
2. An intermediate gain condition represented by +3 volts at the above-noted input.
3. The minimum gain represented by −2 volts at the input.

MAXIMUM GAIN OPERATION

First, the voltage at the junction between resistors 57 and 58 is approximately at 7.5 volts due to the fact that these resistors are made equal and the voltage divider thus formed appears between reference potential and the +15 volts provided by Zener 44 as described above.

The emitter voltage of transistor 32 is approximately at 6.5 volts. The voltage at the collector of transistor 32 is clamped by means of diode 66 which is conducting. Thus the voltage at the collector is approximately 7 volts. Resistors 60 and 61 are selected to be of equal magnitude. Therefore, the voltage at their junction is approximately 3.5 volts. This 3.5 volts is applied to the base electrode of transistor 110 (FIG. 3) which causes a voltage of about 2.8 volts to appear at the base of transistor 75, thus assuring an optimum conduction representative of maximum gain. The positive voltage is also applied to the anode of diode 116 whose cathode is at high potential due to the voltage at the emitter electrode of transistor 94. This assures that diode 116 is cut off and hence maximum gain is provided by transistor 94 as well. It is also noted that transistor 75 is operated in a forward biased AGC mode; thus gain reduction is provided by increasing the collector current. The clamping diode 66 assures that the voltage at the collector of transistors 31 and 32 never becomes less than 7 volts and therefore the transistors 31 and 32 do not saturate, which condition would affect their input impedance by decreasing the same. The decrease in input impedance would therefore serve to load the AGC supply in the receiver and hence reduce AGC control.

INTERMEDIATE GAIN OPERATION

When the voltage at the base electrode of transistor 31 decreases to about +3 volts, less current is directed into the collector electrodes of transistors 31 and 32, resulting in a smaller voltage drop across resistor 62, thus serving to reverse bias diode 66. With diode 66 reverse biased, the voltage at the collector of transistor 32 varies according to the voltage at the base electrode of transistor 31. Therefore, the voltage at the collector increases beyond the aforementioned +7 volts. This causes the voltage at the junction between resistors 60 and 61 to increase.

The increase in voltage causes the voltage at the emitter of transistor 110 (FIG. 3) to increase, thus increasing the voltage at the base electrode of transistor 75. The increase in base voltage at transistor 75 causes the collector current to increase and because of the forward AGC operation, the gain of transistor 75 decreases.

As the AGC voltage increase further, the diode 116 becomes forward biased. This action causes the capacitor 114 to appear in circuit due to the low forward impedance of the diode 116. The capacitor 114 serves to direct a portion of the IF signal to ground, thus reducing the IF output at the collector electrode of transistor 94. This action further serves to reduce the signal available and hence acts as an additional means of gain control. Furthermore, the current supplied via diode 116 is returned via resistor 115. This then causes transistor 94 to conduct less, thus further decreasing the gain in a reverse AGC mode.

Another important operational feature is provided by the combination of transistor-amplifier 94 and diode 116, as will now be explained.

As indicated, the emitter electrode of the transistor common base amplifier 94 is coupled via capacitor 86 to the UHF mixer diode 83.

It is known that the output impedance of such a diode 83 varies according to the amount of oscillator signal applied or injected into the diode. This variation of diode impedance affects the conversion efficiency of the diode and hence adversely affects the amplitude of the output IF signal available.

This effect is compensated for by returning the anode of the mixer diode 83 to the low input impedance available at the emitter electrode of transistor 94.

Due to the fact that the impedance looking into the emitter electrode of a common base amplifier is less than 10 ohms, the diode 83 impedance fluctuations are negligible as the low input impedance of the common base amplifier appears in shunt therewith.

However, as indicated, when diode 116 is conducting the transistor 94 conducts less. Due to the fact that the collector current decreases, the input impedance at the emitter electrode increases.

Therefore, the impedance variation of diode 83 would no longer be negligible. However, when transistor 94 is conducting less, the diode 116 is forward biased and capacitor 114 shunts the emitter input of transistor 94. This therefore lowers the impedance at the emitter and hence continues to compensate for the diode 83 variations.

The above action thus assures proper termination of the mixer diode. For additional details of the operation of the mixer diode. For additional details of the operation of this circuit, reference is made to a copending application filed simultaneously herewith entitled "-HIGH FREQUENCY AUTOMATIC GAIN CONTROL CIRCUITS" (RCA 63,615) by David John Carlson and assigned to the same assignee as herein.

As indicated, the IF output from the collector of transistor 94 is coupled to the base electrode of transistor 45 (FIG. 2) in the UHF mode and hence the output circuit of transistors 45 and 46 serves as an IF output for UHF as well as for VHF.

MINIMUM GAIN OPERATION

For minimum gain operation the voltage at the base electrode of transistor 31 (FIG. 2) is at −2 volts. This voltage cuts off the transistors 31 and 32. This causes the voltage at the collectors to rise towards +15 volts. The voltage at the junction between resistors 60 and 61 is therefore at about +7.5 volts. This high voltage is applied to the base of transistor 110 and then to the base of transistor 75. This causes transistor 75 to conduct even harder, thereby decreasing the gain further.

The diode 116 is further forward biased, thus causing transistor 94 to conduct less and causing capacitor 114 to bypass still more IF signal and hence serving to decrease the gain even further.

It can be seen from the above description that the UHF tuner is controlled in gain by the same voltage levels developed in the receiver to control the VHF tuner. Furthermore, the additional UHF control circuitry does not appreciably load the AGC circuit in the receiver and therefore assures proper control for both VHF and UHF.

What is claimed is:

1. In a television receiver of the type employing a VHF tuner for responding to transmitted television signals in the very high frequency band, and a UHF tuner for responding to transmitted television signals in the ultra-high frequency band, said VHF and UHF tuners each having a separate gain controllable radio frequency amplifier for respectively amplifying said VHF and UHF signals prior to conversion of said signals to video intermediate frequency signals, said receiver further including an automatic gain control circuit having an input responsive to the magnitude of a detected video signal to provide at an output a control signal indicative of the difference of said detected signal from a predetermined value, said control signal being conventionally applied to said radio frequency amplifier in said VHF tuner to control the gain thereof, the improvement therewith of apparatus for developing a second control signal to control the gain of said radio frequency amplifier in said UHF tuner, comprising, a. a first amplifier circuit having a high impedance input terminal and an output terminal, said input impedance of said amplifier being partly a function of the current conducted by said amplifier,
b. means coupled to said input terminal of said first amplifier circuit responsive to said control voltage, for providing at said output terminal of said amplifier a second control voltage,
c. means coupled to said output terminal of said amplifier and responsive to said second control voltage to limit said second voltage at a value determined according to the conduction of said amplifier to prevent said input impedance from substantially varying, and
d. means coupled between said output of said first amplifier and said UHF radio frequency amplifier for applying said second control voltage thereto to vary said gain according to the magnitude of said second control voltage.

2. The apparatus according to claim 1 wherein said first amplifier comprises, a. first and second transistors each having a base, collector and emitter electrode, the collector electrode of said first and second transistors being connected together, the emitter electrode of said first coupled to the base electrode of said second transistor,
b. a resistor, coupling the emitter electrode of said second transistor to a point of reference potential,
c. means coupled to said collector electrode connection adapted for application thereto of a source of operating potential.

3. The apparatus according to claim 1 wherein said means coupled to said output terminal of said amplifier, comprises, a. a unilateral current conducting device, having first and second terminals and poled for easy current conduction from said first to said second terminals, said second terminal coupled to the output of said amplifier,
b. a voltage divider,
c. means coupling said first electrode of said current device to said divider to cause said device to conduct when a voltage at the output of said amplifier is less than the voltage on said first terminal of said current device.

4. In a television receiver having automatic gain control circuitry for providing an automatic gain control voltage adapted to control the gain of a VHF radio frequency amplifier having a maximum gain for a given positive voltage and a minimum gain for a predetermined negative voltage, said automatic gain control circuitry operating in response to a detected video signal to provide said control voltage between said predetermined negative level and said given positive level to accordingly control the gain of said VHF radio frequency amplifier, the improvement therewith of apparatus for deriving a UHF automatic gain control voltage, comprising:

a. a first common base transistor amplifier configuration having an emitter input terminal and a collector output terminal, said amplifier having a gain characteristic which decreases according to an increase in current flow between the emitter to collector path, b. means coupled to said input terminal adapted to receive UHF television signals, c. a second common emitter transistor amplifier configuration having a large input impedance at the base electrode thereof determined in part by the current flowing through said transistor, said transistor having a collector electrode output terminal, d. means coupled to said base electrode of said second amplifier for applying said automatic gain control voltage thereto, to cause said amplifier to provide at said collector electrode a large positive voltage for said predetermined negative voltage and a smaller positive voltage for said given positive voltage, e. means coupled to said collector electrode of said second amplifier and responsive to said smaller positive voltage for limiting said voltage at a desired level, to prevent said input impedance of said second amplifier from decreasing, f. means coupling said collector electrode of said second common emitter transistor amplifier to the base electrode of said first common base amplifier for controlling the gain thereof and therefore the magnitude of said UHF signals.

5. The apparatus according to claim 4 wherein said means coupling said collector electrode of said second common emitter amplifier to the base electrode of said first common base amplifier, comprises, a. first and second series resistors coupled between the collector electrode of said second common emitter transistor amplifier and a point of reference potential, the junction between said first and second resistors being coupled to the base electrode of said first common base amplifier.

6. The apparatus according to claim 4 wherein said means coupled to said collector electrode of said second amplifier, comprises, a. a clamping diode having first and second terminals and poled for easy current conduction from said first to second terminal, said first terminal being connected to said collector electrode of said second amplifier, and b. a source of bias voltage coupled to said second terminal.

* * * * *